US012687789B2

(12) United States Patent
Min et al.

(10) Patent No.: US 12,687,789 B2
(45) Date of Patent: Jul. 21, 2026

(54) CORRECTION METHOD OF MULTI-BEAM EXPOSURE DEVICE

(71) Applicants: Samsung Display Co., LTD., Yongin-si (KR); SAMSUNG ELECTRONICS CO., LTD., Suwon-si (KR)

(72) Inventors: Choulwon Min, Yongin-si (KR); Sukjong Bae, Yongin-si (KR)

(73) Assignees: Samsung Display Co., LTD., Gyeonggi-do (KR); Samsung Electronics Co., Ltd, Gyeonggi-do (KR)

( * ) Notice: Subject to any disclaimer, the term of this patent is extended or adjusted under 35 U.S.C. 154(b) by 86 days.

(21) Appl. No.: 18/597,732

(22) Filed: Mar. 6, 2024

(65) Prior Publication Data

US 2024/0302750 A1 Sep. 12, 2024

(30) Foreign Application Priority Data

Mar. 6, 2023 (KR) ........................ 10-2023-0029315

(51) Int. Cl.
*G03F 7/00* (2006.01)
*H01J 37/317* (2006.01)
(52) U.S. Cl.
CPC ........ *G03F 7/70558* (2013.01); *G03F 7/7005* (2013.01); *G03F 7/70508* (2013.01); *G03F 7/70516* (2013.01); *H01J 37/3177* (2013.01); *H01J 2237/31761* (2013.01); *H01J 2237/31774* (2013.01)

(58) Field of Classification Search
CPC .............. G03F 7/70558; G03F 7/7005; G03F 7/70291; G03F 7/70383; H01J 37/3174; H01J 37/3177; H01J 2237/31774
See application file for complete search history.

(56) References Cited

U.S. PATENT DOCUMENTS

| | | | | |
|---|---|---|---|---|
| 6,819,450 B1* | 11/2004 | Jolley | ................. | G03F 7/70383 358/1.9 |
| 7,508,570 B1* | 3/2009 | Meisburger | ......... | G03F 7/70508 359/290 |

(Continued)

FOREIGN PATENT DOCUMENTS

KR 10-2435390 8/2022

*Primary Examiner* — Steven H Whitesell
(74) *Attorney, Agent, or Firm* — Harness, dickey & Pierce, P.L.C.

(57) ABSTRACT

A correction method may include generating a first function that is a relational expression between a gray level of an edge beam among beams and a variation amount in size of a pattern according to a second beam adjacent to the edge beam, obtaining a second function that is a relational expression between the first function, the gray level of the edge beam, and a variation amount in a deviation amount of a CD and the deviation amount of the CD according to each of the beams, generating a matrix equation by adding all of second functions according to multi-beam combinations in which the beams are differently combined, deriving a solution of the matrix equation by measuring the deviation amount of the CD, and deriving an optimal dose of each of the beams by using the solution of the matrix equation.

20 Claims, 9 Drawing Sheets

PT:PT1,PT2,PT3,PT4,⋯PT121

(56)                    References Cited

U.S. PATENT DOCUMENTS

| | | | |
|---|---|---|---|
| 2004/0131977 A1* | 7/2004 | Martyniuk | G03F 1/78 |
| | | | 430/394 |
| 2008/0189674 A1* | 8/2008 | Taniguchi | G03F 7/70291 |
| | | | 716/55 |
| 2015/0362834 A1* | 12/2015 | Choi | G03F 1/78 |
| | | | 250/492.22 |
| 2019/0214226 A1* | 7/2019 | Platzgummer | H01J 37/3026 |

* cited by examiner

| r<br>[gray-level ratio] | REF | AFT Optimization |
|---|---|---|
| | RANGE | RANGE |
| 1 | 93nm | 52nm |
| 0.8 | 110nm | 41nm |
| 0.6 | 128nm | 46nm |
| 0.4 | 118nm | 48nm |
| 0.2 | 121nm | 45nm |
| 0 | 96nm | 50nm |
| AVG | 135nm | 54nm |

CORRECTION METHOD OF MULTI-BEAM EXPOSURE DEVICE

CROSS-REFERENCE TO RELATED APPLICATION

This application claims priority to and benefits of Korean Patent Application No. 10-2023-0029315 under 35 U.S.C. § 119, filed on Mar. 6, 2023 in the Korean Intellectual Property Office (KIPO), the entire contents of which are incorporated herein by reference.

BACKGROUND

1. Technical Field

Embodiments generally relate to a display device. More particularly, embodiments relate to a correction method of multi-beam exposure device used in manufacturing the display device.

2. Description of the Related Art

In general, an exposure process is used when forming a pattern on a substrate constituting a display device. For example, a pattern is formed by first applying a photoresist layer to a substrate, and selectively exposing the photoresist layer using a photomask to selectively remove parts having different characteristics or other parts.

The exposure process may be performed using a multi-beam exposure device. The multi-beam exposure device may radiate multi-beams. The multi-beams may be a combination of beams having the same or different dose amount. In this case, in case that the dose amount of the beam is large, the size of the exposed pattern may be increased, and in case that the dose amount of the beam is small, the size of the exposed pattern may be decreased. Accordingly, the width and size of the pattern may be adjusted by combining multi-beams of the multi-beam exposure device. A dose amount of the multi-beams of the multi-beam exposure device may be adjusted to reduce dispersion of the width and size of the pattern.

SUMMARY

Embodiments provide a correction method of multi-beam exposure device that individually corrects multi-beams of the multi-beam exposure device.

The technical objectives to be achieved by the disclosure are not limited to those described herein, and other technical objectives that are not mentioned herein would be clearly understood by a person skilled in the art from the description of the disclosure.

A correction method of a multi-beam exposure device includes generating a first function that is a relational expression between a gray level of an edge beam among a plurality of beams and a variation amount in size of a pattern according to a second beam adjacent to the edge beam, obtaining a second function that is a relational expression between the first function, the gray level of the edge beam, and a variation amount in a deviation amount of a CD (critical dimension) and the deviation amount of the CD according to each of the plurality of beams, generating a matrix equation by adding all of second functions according to multi-beam combinations in which the plurality of beams are differently combined, deriving a solution of the matrix equation by measuring the deviation amount of the CD, deriving an optimal dose amount of each of the plurality of beams by using the solution of the matrix equation, and correcting a dose amount of each of the plurality of beams of the multi-beam exposure device individually by using the optimal dose amount of each of the plurality of beams.

In an embodiment, the deviation amount may be a difference between an average value of size of patterns and a measured value of each size of the patterns.

In an embodiment, the gray level of the edge beam and the variation amount in the size of the pattern according to the second beam may be in inverse proportion to each other.

In an embodiment, the first function may be a first-order or higher-order function in which the gray level of the edge beam and the variation amount in the size of the pattern according to the second beam are in inverse proportion to each other.

In an embodiment, the first function may be represented by Equation 1 below:

[Equation 1]

$$f(r) = 4.02r^3 - 7.12r^2 + 1.03r + 2.69$$

wherein, r may be the gray level of the edge beam, r may be 0 or more and 1 or less, and f(r) may be a variation amount in the size of the pattern according to the second beam.

In an embodiment, the second function may be represented by Equation 2 below:

[Equation 2]

$$CD_{n,m} = E_n \times r_n + E_{n+1} \times S(r_n) + E_m \times r_m + E_{m-1} \times S(r_m)$$

wherein, each of n and m may be integer, each of n and m may be $0 \leq r \leq 1$, n may be a number of a leftmost edge beam, m may be a number of a rightmost edge beam, r may be the gray level of the edge beam, E may be the variation amount in the deviation amount of the CD according to edge beam, $CD_{n,m}$ may be the deviation amount of the CD, and S(r) may be ratio of f(r) of the first function divided by f(0) of the first function.

In an embodiment, a maximum value of each of the n and m may be equal to the number of the beams.

In an embodiment, the matrix equation may be represented by Equation below:

[Equation]

$$A \times B = C$$

wherein A matrix may be an N×N square matrix including one of a, b, and c, B matrix may be an N×1 matrix including E1 to EN values, and C matrix may be an N×1 matrix including a value obtained by adding the deviation amounts of the CD where the n is 1 and the m is from 1 to N to a value obtained by adding the deviation amounts of the CD where the n is N and the m is from 1 to N, the N may be the number of beams and the a may be S(1−r)+10×r+1, the b may be 11×S(r)+S(1−r)−r+1, and the c may be S(1−r)−r+1 where rn+rm=1.

In an embodiment, the deriving of the solution of the matrix equation may include deriving values of the C matrix of the matrix equation by measuring the deviation amount of the CD, and calculating values of the B matrix, which are a solution of the matrix equation.

In an embodiment, the deriving of the optimal dose of the plurality of beams may include converting the values of the B matrix into correction amounts of the optimal dose amount and deriving the optimal dose amount for each of the plurality of beams by subtracting the correction amounts of the optimal dose amount from measured dose amounts of the plurality of beams, respectively.

In an embodiment, the converting of the values of the B matrix into correction amounts of the optimal dose amount may include dividing the values of the B matrix by the value of the f(0).

In an embodiment, the deriving of the values of the C matrix may include deriving a deviation amount of the CD of each of patterns in a combination pattern including N×N patterns.

In an embodiment, the combination pattern may include patterns formed by a multi-beam combination consisting of the combination of different beams among the plurality of beams.

In an embodiment, the combination pattern may include patterns having a same size in a first direction and formed by a multi-beam combination including different edge beams.

In an embodiment, the combination pattern may include patterns having different sizes in a second direction intersecting the first direction and formed by a multi-beam combination in which one edge beam is a same.

In an embodiment, the deriving of the deviation amount of the CD of each of the patterns may include measuring a measurement value of a size of each of the patterns included in the combination pattern, calculating an average value of sizes of patterns located in a same row in the first direction in the combination pattern, and calculating the deviation among of the CD by subtracting the average value from the measured value of the size of each of the patterns.

In an embodiment, the deriving of the values of the C matrix may further include deriving the values of the C matrix by adding the deviation amount of the CD of each of patterns located in a same column in the second direction in the combination pattern.

In an embodiment, the correcting of the dose amount of each of the plurality of beams individually may further include changing the gray level of the edge beam of the multi-beam exposure device, deriving the optimal dose amounts of each of the plurality of beams for each gray level, deriving a final optimal dose amount that is an average value of the optimal dose amounts, and correcting a dose amount of each of the plurality of beams individually by comparing the final optimal dose amount of each of the plurality of beams and a measured dose amount of each of the plurality of beams.

In an embodiment, in the changing of the gray level of the edge beam of the multi-beam exposure device, gray levels may be changed to different gray level values at regular intervals.

In an embodiment, the multi-beam exposure device may be configured to manufacture a display device using the correction method.

In case that a correction is performed according to a correction method of a multi-beam exposure device according to the embodiments of the disclosure, the dose amount of each of the plurality of beams included in the multi-beam exposure device may be individually corrected. By considering the variation amount in the deviation amount of the CD according to each beam, the gray level of the edge beam, and the effect on the variation amount in the size of pattern of the second beam according to the gray level of the edge beam, optimal dose amount in various multi-beam combinations may be calculated. In case that exposure is performed with a plurality of beams corrected to the optimal dose amount, since the deviation amount of the CD is minimized, size distribution of patterns according to the multi-beam combinations may be reduced. For example, in case that the multi-beam exposure device is corrected through the correction method, the size distribution of the patterns may be reduced in an exposure process using the multi-beam exposure device.

BRIEF DESCRIPTION OF THE DRAWINGS

Illustrative, non-limiting embodiments will be more clearly understood from the following detailed description in conjunction with the accompanying drawings.

FIG. 8 is a table for explaining the effect of the disclosure.

DETAILED DESCRIPTION OF THE EMBODIMENTS

Figure 1:
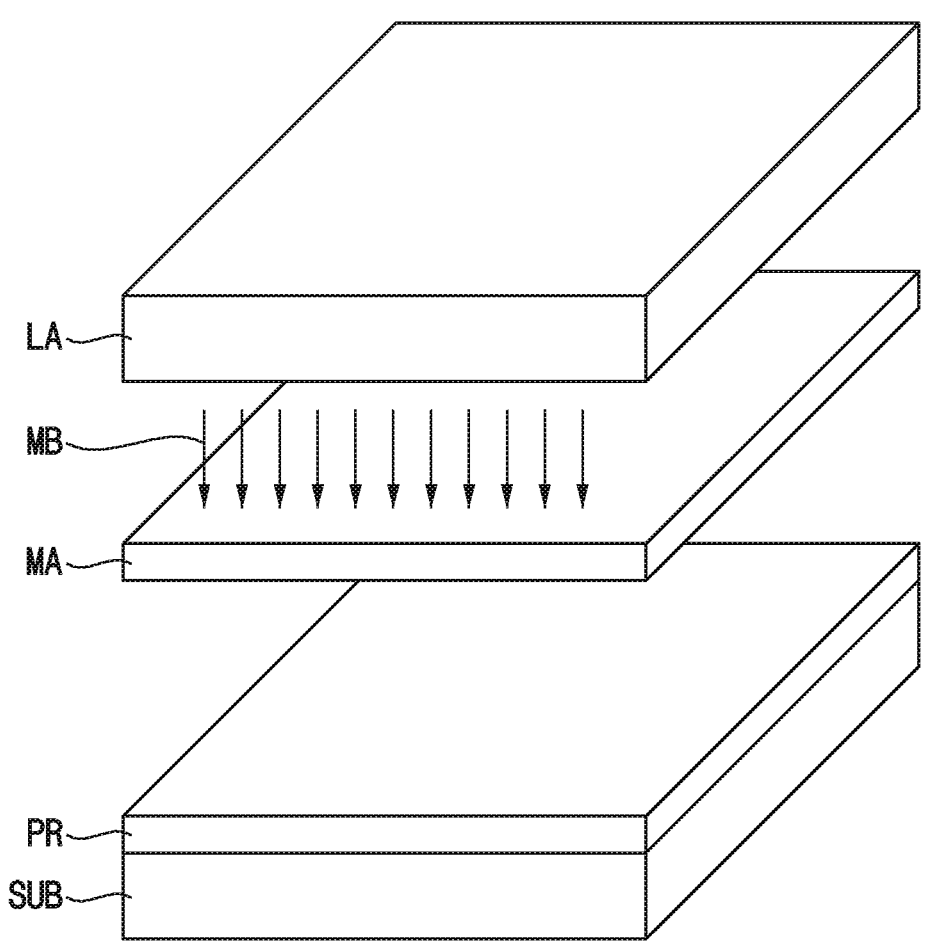
FIG. 1 is a schematic perspective view illustrating a multi-beam exposure device according to an embodiment of the disclosure.

Hereinafter, embodiments of the disclosure will be explained in detail with reference to the accompanying drawings. The same reference numerals are used for the same components in the drawings, and redundant descriptions of the same components will be omitted.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view illustrating a multi-beam exposure device according to an embodiment of the disclosure.

Referring to FIG. 1, a multi-beam exposure device LA may perform an exposure process using multi-beams.

Specifically, a photoresist layer PR may be formed on the substrate SUB. A photo mask MA on which a pattern is formed may be positioned on the photoresist layer PR. The multi-beam exposure device LA may radiate the multi-beams onto the photoresist layer PR. The multi-beams radiated from the multi-beam exposure device LA may pass through the photo mask MA on which the pattern is formed and reach the photoresist layer PR. In case that the multi-beams reach the photoresist layer PR, characteristics of the photoresist layer PR radiated with the multi-beams may change. For example, the photoresist layer PR radiated with the multi-beams may become hard. Accordingly, characteristics of the photoresist layer PR may be changed according to the pattern of the photomask MA. Thereafter, in a developing process, a part of the photoresist layer PR that has not been radiated with the multi-beams through the photo mask MA may be removed by a developing solution. Accordingly, a photoresist pattern having the same pattern as the pattern of the photomask MA may be formed. Hereinafter, the size of the pattern may denote the width of a part of the photoresist layer PR whose characteristics are changed by the exposure process.

At this time, the multi-beam exposure device LA may radiate the multi-beams MB. The multi-beams MB may be a combination of beams having the same or different dose amounts. In this case, in case that the dose amount of the beam is large, the size of the pattern may be increased, and in case that the dose amount of the beam is small, the size of the pattern may be decreased. Accordingly, the multi-beam exposure device LA may adjust the width and size of the pattern by combining the multi-beams MB.

Figure 2:
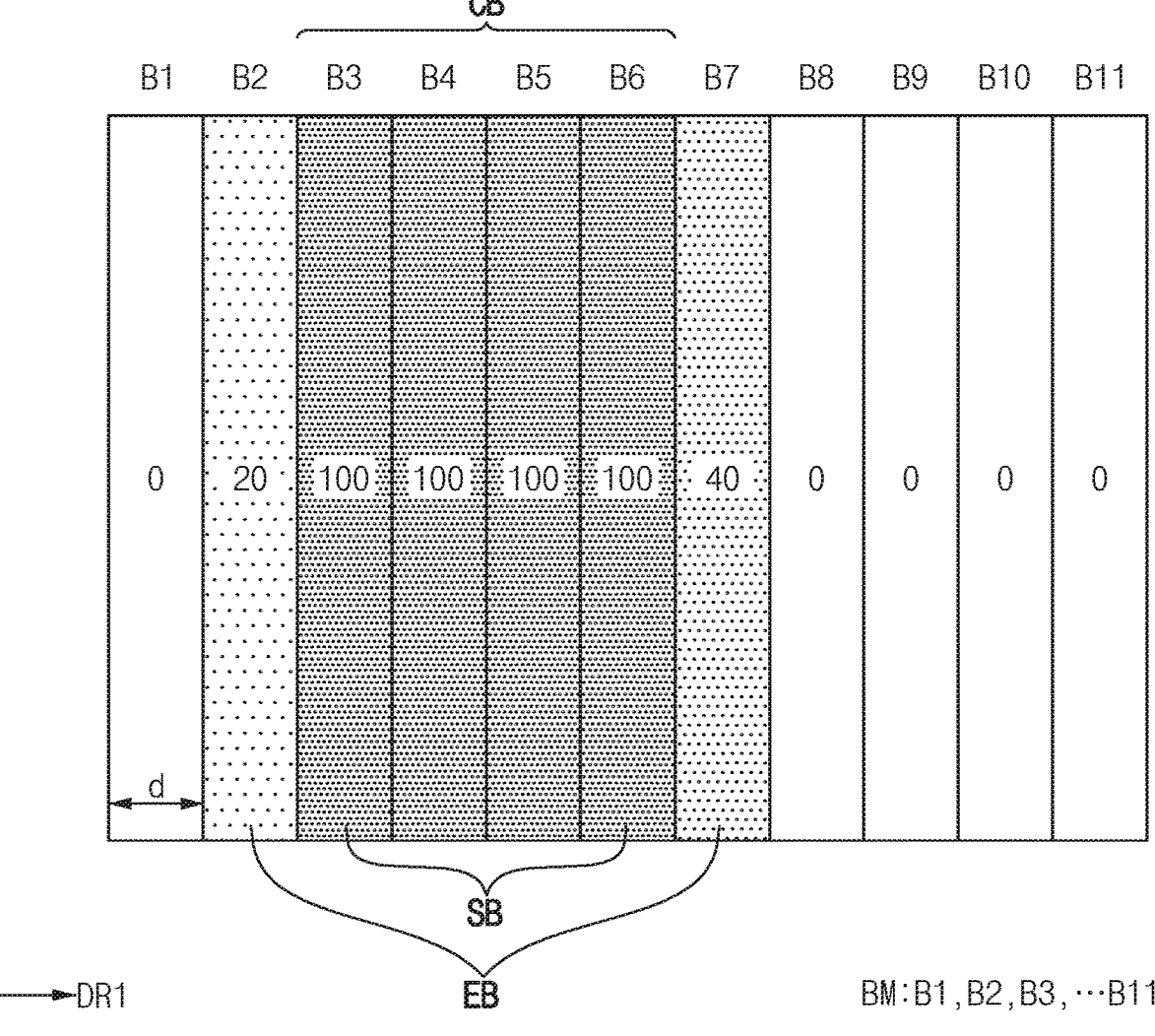
FIG. 2 is a schematic plan view illustrating an example of beams included in a multi-beam of the multi-beam exposure device of FIG. 1.

FIG. 2 is a schematic plan view illustrating an example of beams included in a multi-beam of the multi-beam exposure device of FIG. 1.

Referring to FIGS. 1 and 2, the multi-beam exposure device LA may radiate by combining 11 beams BM. The beams BM may denote beams included in the multi-beams MB, and sub-exposure devices respectively that radiates beams included in the multi-beams MB. However, the disclosure is not limited thereto, and the multi-beam exposure device LA may include the beams of twelve or more, or the beams of ten or less.

The multi-beam exposure device LA may radiate as many multi-beams as the number of beams to be used corresponding to the size of the pattern in a first direction DR1. For example, in case that a distance d between the beams BM in the first direction DR1 is about 0.35 micrometers, and the size of the pattern in the first direction DR1 is about 2 micrometers, the six beams BM may be radiated from the multi-beam exposure device LA. At this time, in order to match the size of the pattern, the multi-beam exposure device LA may adjust the dose amount of edge beams EB.

Specifically, the dose amount of center beams CB included in the multi-beam exposure device LA may be larger than the dose amount of the edge beams EB. For example, in case that the center beams CB have a dose amount of about 100%, the edge beams EB may have a dose amount of less than about 100%. The edge beams EB may denote to beams at the most edge among the radiated beams BM (e.g., a second beam B2 and a seventh beam B7 of FIG. 2). The center beams CB may denote to beams (e.g., third, fourth, fifth, and sixth beams B3, B4, B5, and B6 of FIG. 2) other than the edge beams EB among the radiated beams BM.

A ratio of the edge beams EB having a lower dose than the center beams CB may be referred to as a gray level of the edge beams EB. Through this, the multi-beam exposure device LA may perform exposure according to the size of various patterns.

Accordingly, the size of the pattern may be greatly affected by the dose amount of the edge beams EB of the multi-beam exposure device LA. For example, in case that the dose amount of the edge beams EB is large, the size of the pattern may also be increased, and in case that the dose amount of the edge beams EB is small, the pattern size may also be decreased.

The size of the pattern may be affected by the second beams SB right next to the edge beams EB of the multi-beam exposure device LA. For example, the second beams SB may denote to a beam (e.g., the third beam B3 of FIG. 2) located right next to (e.g., to the right) of the leftmost beam (e.g., the second beam B2 of FIG. 2) among the edge beams EB and a beam (e.g., the sixth beam B6 of FIG. 2) located right next to (e.g., to the left) of the rightmost beam (e.g., the seventh beam B7 of FIG. 2).

The effect of the second beams SB on the size of the pattern may be smaller than the effect of the edge beams EB on the size of the pattern. The effect of the second beams SB on the size of the pattern may vary according to the gray level of the edge beams EB on the size of the pattern.

In an embodiment, a first function that is a relational expression between the gray level of the edge beam EB and the variation amount in the size of the pattern according to the second beam SB may be generated. As the gray level of the edge beam EB increases, the variation amount in the size of the pattern according to the second beam SB may decrease. For example, the gray level of the edge beam EB and the variation amount in the size of the pattern according to the second beam SB may be in inverse proportion to each other.

Accordingly, the first function may be a first-order or higher-order function in which the gray level of the edge beam EB and the variation amount in the size of the pattern according to the second beam SB are in inverse proportion to each other. For example, the first function may be represented by Equation 1 below.

[Equation 1]

$$f(r) = 4.02r^3 - 7.12r^2 + 1.03r + 2.69$$

Here, r may be the gray level of the edge beam EB, r may be 0 or more and 1 or less, and f(r) may be a variation amount in the size of the pattern according to the second beam SB. The distance d between the beams BM in the first direction DR1 may be about 0.35 micrometers. However, the f(r) according to the disclosure is not limited thereto, and the f(r) may be a first-order or higher-order function in which the r and the f(r) are in inverse proportion to each other.

Figure 3:
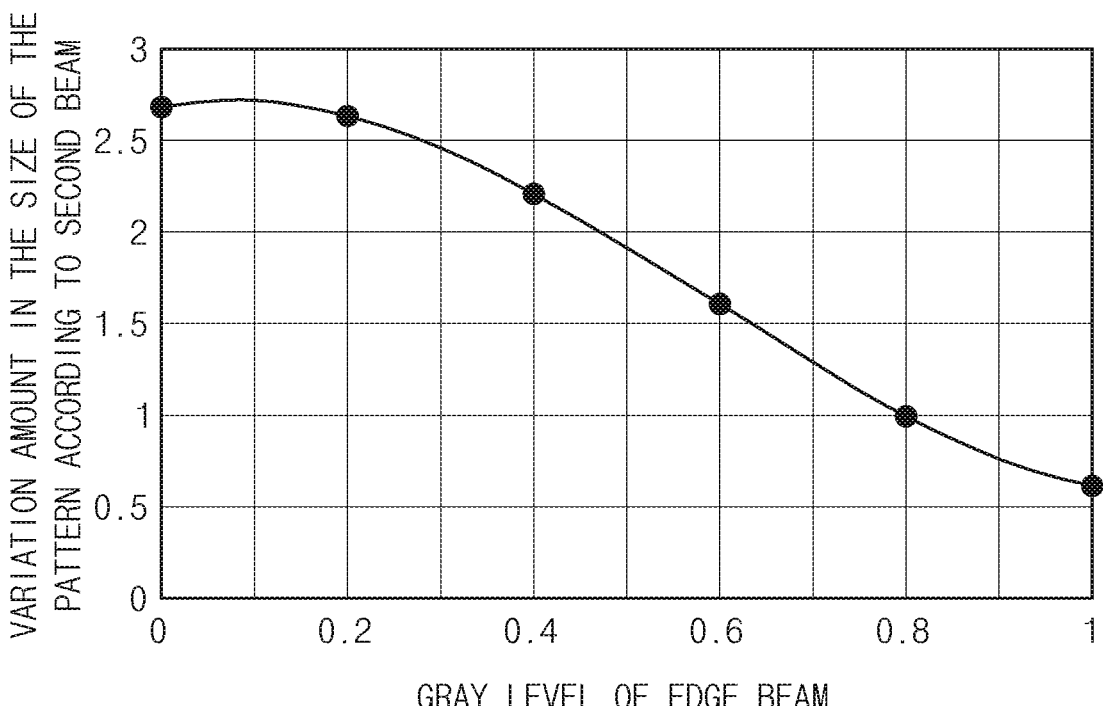
FIG. 3 is a graph illustrating a function between a gray level of an edge beam and a variation amount in a size of a pattern according to a second beam.

FIG. 3 is a graph illustrating a function between a gray level of an edge beam and a variation amount in a size of a pattern according to a second beam.

For example, FIG. 3 may be a graph illustrating the first function.

Referring further to FIG. 3, X axis of the graph may be the gray level of the edge beam EB, and Y axis of the graph may be the degree of effect of the second beam SB on the size of the pattern. For example, the Y axis of the graph may denote the variation amount in size of the pattern according to the second beam SB.

Referring to the graph, that the variation amount in the size of the pattern according to the second beam SB decreases as the gray level of the edge beam EB increases may be confirmed. Since the gray level of the edge beam EB being large denotes that the dose amount of the edge beam EB increases, the variation amount in the size of the pattern by the edge beam EB may increase, and the variation amount in the size of the pattern according to the second beam SB may decrease.

The size of the pattern may be affected by the factors (e.g., the gray level of the edge beam EB, the dose amount of the beams BM, and the first function). Specifically, the difference (hereinafter, a deviation amount of a CD (critical dimension)) between the measured value of the size of the pattern and the average value of the size of the pattern by the multi-beam exposure device LA before correction may be affected by the factors as expressed in Equation 2 below. For example, a second function that is a relational expression between the first function, the gray level of the edge beam EB, and the variation amount in the deviation amount of the CD and the deviation amount of the CD according to each of the beams BM may be obtained.

The deviation amount of the CD may be a difference between an average value of the size of the patterns and a measured value of each size of the patterns. The second function may be represented by the Equation 2 below.

[Equation 2]

$$CD_{n,m} = E_n \times r_n + E_{n+1} \times S(r_n) + E_m \times r_m + E_{m-1} \times S(r_m)$$

Here, each of n and m is integer, each of n and m is $0 \leq r \leq 1$, $E_{12} = E_1$, and $E_0 = E_{11}$.

In this case, $1 \leq n$ and $m \leq 11$ may be satisfied. The n and m may vary according to the number of beams. For example, the maximum value of each of the n and m may be equal to the number of beams. For another example, in case that the number of the beams BM is 15, $1 \leq n$ and $m \leq 15$ may be satisfied.

The n may be the number of the leftmost edge beam EB, the m may be the number of the rightmost edge beam EB, n−1 may be the left second beam SB, and m−1 may be the right edge beam EB. In addition, $r_n$ may be the gray level of the leftmost edge beam EB, and $r_m$ may be the gray level of the rightmost edge beam EB. In addition, $E_n$ may be the variation amount in the deviation amount of the CD according to the leftmost edge beam EB, and $E_m$ may be the variation amount in the deviation amount of the CD according to the rightmost edge beam EB. S(r) may be ratio of a value (e.g., the f(r)) of the first function divided by f(0) (e.g., the y-intercept of the graph of FIG. 3) of the first function. $CD_{n,m}$ may be the deviation amount of the CD.

For example, the deviation amount of the CD may vary according to the variation amount in the deviation amount of the CD according to the edge beams EB, the variation amount in the deviation amount of the CD according to the second beams SB, the gray level of the edge beam EB, and the first function.

Hereinafter, in the second function, the gray level values $(r_n, r_m)$ of the edge beam EB may be fixed, and the process may be performed by setting $r_n + r_m = 1$. In this case, the second function is as follows.

[Equation 2]

$$CD_{n,m} = E_n r + E_{n+1} S(r) + E_m (1 - r) + E_{m-1} S(1 - r)$$

In the second function, for convenience of calculation, the n may be fixed to 1, and all possible combinations of the deviation amount $(CD_{n,m})$ of the CD may be added.

$$CD_{1,1} = E_1 r + E_2 S(r) + E_1 (1 - r) + E_{11} S(1 - r) +$$

$$CD_{1,2} = E_1 r + E_2 S(r) + E_2 (1 - r) + E_1 S(1 - r) +$$

$$\dots CD_{1,11} = E_1 r + E_2 S(r) + E_{11} (1 - r) + E_{10} S(1 - r) =$$

$$\sum_{m=1}^{11} CD_{1,m} = E_1 \times (S(1 - r) + 10 \times r + 1) + E_2 \times$$

$$(11 \times S(r) + S(1 - r) - r + 1) + (E_3 + E_4 + \dots + E_{11}) \times (S(1 - r) - r + 1)$$

Specifically, the beams BM may be combined differently to form a multi-beam combination. Therefore, as in the case of fixing the n to 1, the n may be fixed sequentially from 2 to 11, and all possible combinations of the deviation amount $(CD_{n,m})$ of the CD may be added.

Accordingly, a matrix equation may be generated by adding all of the second functions according to the multi-beam combination. For example, where the n is 1, all combinations where the m is 1 to 11 may be added, where the n is 2, all combinations where the m is 1 to 11 may be added, finally where n is 11, all combinations where the m 1 to 11 may be added, and the matrix equation of FIG. 4 may be derived as a conclusion.

Figure 4:
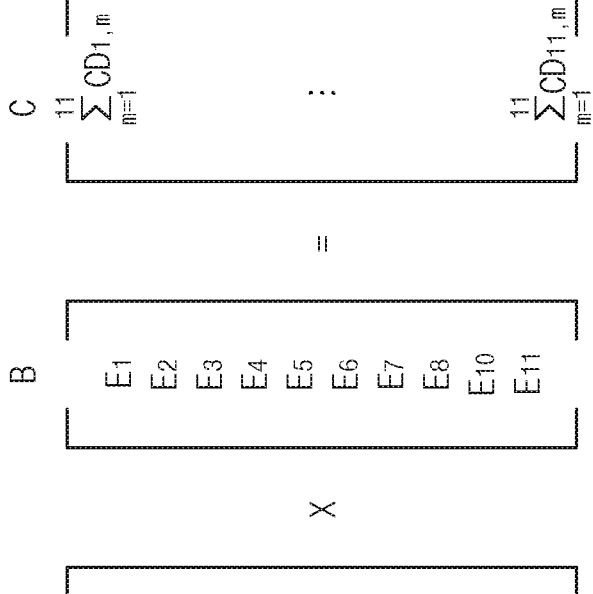
FIG. 4 is a schematic view illustrating a matrix for performing a correction method of a multi-beam exposure device.

FIG. 4 is a schematic view illustrating a matrix for performing a correction method of a multi-beam exposure device.

Referring to FIG. 4, a matrix equation of A×B=C may be generated. In case that the number of the beams BM is N, the A matrix may be an N×N matrix including one of a, b, and c. The B matrix may be an N×1 matrix including $E_1$ to $E_N$ values. The C matrix may be an N×1 matrix including a value obtained by adding the deviation amounts of the CD where m is 1 to N where n is 1 to a value obtained by adding the deviation amounts of the CD where m is 1 to N where n is N.

For example, in case that the number of the beams BM is 11, the A matrix may be an 11×11 matrix. The A matrix may be a square matrix including one of a, b, and c. In this case, the a may be S(1−r)+10×r+1, the b may be 11×S(r)+S(1−r)−r+1, and the c may be S(1−r)−r+1.

The B matrix may be an 11×1 matrix. The B matrix may include $E_1$ to $E_{11}$. The $E_1$ to $E_{11}$ may be variation amounts in the deviation amount of the CD according to each of the beams BM. For example, The $E_1$ may be a value indicating how many microns the first beam B1 affects the deviation amount of the CD where n is 1, that is, in combinations of the multi-beams BM in which the first beam B1 is located on the leftmost side and m is varying from 1 to 11.

The C matrix may include a value (e.g., $$\sum_{m=1}^{11} CD_{1,m})$$

obtained by adding the deviation amounts of the CDs where m is 1 to 11 where n is 1 to a value (e.g., $$\sum_{m=1}^{11} CD_{11,m})$$

obtained by adding the deviation amounts of the CDs where m is 1 to 11 where n is 11. The C matrix may be an 11×1 matrix. Values of the C matrix may be derived by measuring the deviation amount of the CD. The step of the deriving the values of the C matrix may be described in more detail with reference to FIG. 5.

The $E_1$ to $E_{11}$ values of the B matrix may be calculated to obtain the variation amount in the deviation amount of the CD according to each of the beams BM. Specifically, the values of the A matrix may be derived by fixing the gray level value r of the edge beam EB. The values of the C matrix may be derived by measuring the deviation amount of the CD. Accordingly, the values of the B matrix, which is a solution of the matrix equation, may be calculated by changing the matrix equation of A×B=C in FIG. 4 to B=A$^{-1}$×C.

The optimal dose amount of each of the beams BM may be derived using the values of the B matrix. Specifically, since each of the $E_1$ to $E_{11}$ values of the B matrix is a numerical value representing the variation amount in the deviation amount of the CD according to each of the beams BM, the difference (hereinafter referred to as the optimal dose amount correction amount) between the optimal dose amount and the measured dose amount may be derived by dividing the $E_1$ to $E_{11}$ values of the B matrix by a specific value. For example, the values of the B matrix may be converted into the optimal dose amount correction amount. According to Equation 3 below, the optimal dose amount correction amount may be finally derived.

[Equation 3]

$$Dose = \frac{B}{xnm/\% \ dose}$$

For example, the numerical value B related to the deviation amount of the CD may be converted into the optimal dose amount correction amount (Dose) for each beam. The specific value x may be derived as the f(0) value from the first function. For example, the specific value x may be the variation amount in the size of the pattern according to the second beam SB in case that the gray level of the edge beam EB is 0. Therefore, the difference (Dose) between the optimal dose amount and the measured dose amount may be calculated by dividing each $E_1$ to $E_{11}$ values of the B matrix by the specific value x. For example, according to the graph of FIG. 3, the specific value x may be about 2.69. However, the disclosure is not limited thereto.

Finally, the optimal dose amount for each of the beams BM may be derived by subtracting the optimal dose amount correction amounts of the beams BM from the measured dose amounts of the beams BM.

Specifically, the multi-beam exposure device LA may be corrected so that the value C of the deviation amount of the CD becomes 0 through the above-described correction method. For example, through the matrix equation, using the multi-beam exposure device LA before correction, in case that the deviation amount of the CD is not 0 and a specific value exists, numerical values (i.e., the B matrix) affecting the deviation amount of the CD for each beam may be calculated. The optimal dose amount correction amount (Dose) obtained using the $E_1$ to $E_{11}$ values of the B matrix may be a dose amount deviation amount that affects the deviation amount of the CD for each beam. Therefore, by subtracting the optimal dose amount correction amount (Dose) from the measured dose amount for each beam, the optimal dose amount such that the value C of the deviation amount of the CD becomes 0 may be derived.

Hereinafter, a method for obtaining the sigma CD value will be described in detail.

Figure 5:
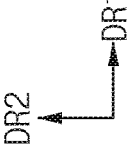
FIG. 5 is a schematic view for explaining values of the C matrix of FIG. 4.

FIG. 5 is a schematic view for explaining values of a C matrix of FIG. 4.

For example, FIG. 5 is a view for explaining a combination pattern formed through multi-beam combination.

Referring further to FIG. 5, a combination pattern CP may include patterns PT formed by combining multi-beams formed by combining different beams among the beams BM. The combination pattern CP may include N×N patterns PT. For example, in case that the number of the beams BM is 11, the combination pattern CP may include 121 patterns PT.

The combination pattern CP may include N lines LN extending in the second direction DR2. For example, the combination pattern CP may include 11 lines LN extending in the second direction DR2. However, the disclosure is not limited thereto. The second direction DR2 of the combination pattern CP may cross (or intersect) the first direction DR1. The width of each of the lines LN in the first direction DR1 may denote the size of the pattern. Each of the lines LN may be a combination of patterns (e.g., a first pattern PT1 and a third pattern PT3) having different sizes.

In an embodiment, the combination pattern CP may include patterns (e.g., the first pattern PT1 and a second pattern PT2) having the same size as each other in the first direction DR1 and formed by a multi-beam combination including edge beams EB different from each other.

Specifically, in the combination of patterns in the first direction DR1 among the combination patterns CP, the sizes of the patterns may be the same. For example, in the first pattern PT1 located at the lower left of the combination pattern CP, the leftmost beam may be 1, and the rightmost beam may be 1. In the second pattern PT2 adjacent to the first pattern PT1 in the first direction DR1, the leftmost beam may be 2, and the rightmost beam may be 2. For example, in the multi-beam combination in the first direction DR1, the sizes of the patterns may be the same, and the number of multi-beams of the edge beams EB may increase by one.

In an embodiment, the combination pattern CP may include patterns (e.g., the first pattern PT1 and the third pattern PT3, or the second pattern PT2 and fourth pattern PT4) having different sizes in the second direction DR2 and in which one edge beam EB is formed by the same multi-beam combination.

Specifically, in the multi-beam combination in the second direction DR2, the size of the pattern may increase in the second direction DR2. For example, in the first pattern PT1, the leftmost beam may be 1, and the rightmost beam may be 1. In the third pattern PT3 adjacent to the first pattern PT1 in the second direction DR2, the leftmost beam may be 1, and the rightmost beam may be 2. For example, the size of the third pattern PT3 may be larger than the size of the first pattern PT1. Similarly, in the second pattern PT2, the leftmost beam may be 2, and the rightmost beam may be 2. In the fourth pattern PT4 adjacent to the second pattern PT2 in the second direction DR2, the leftmost beam may be 2, and the rightmost beam may be 3. For example, the size of the fourth pattern PT4 may be larger than the size of the second pattern PT2. Accordingly, the lines LN may increase in width in the first direction DR1 toward the second direction DR2. For example, in the multi-beam combination in the second direction DR2, the size of the pattern may increase in the second direction DR2, and the number of beams may increase by one in the second direction DR2.

In the same or similar way, the size of each of the 11 patterns PT per line may be measured, and through this, all of the 11 lines LN may be measured. Accordingly, the measurement value of each size of a total of 121 patterns PT included in the combination pattern CP may be measured.

Thereafter, the difference (e.g., the deviation amount of the CD) between the average value of the measured size and the average size of each of the patterns PT may be derived. Specifically, since the patterns have the same size in the first direction DR1, the average value of the sizes of the patterns (e.g., the first pattern PT1 and the second pattern PT2) located in the same row may be calculated. The difference obtained by subtracting the average value of the size of each pattern from the measured value of the size of each pattern located in the same row for each pattern PT may be derived. For example, the deviation amount of the CD of each of the patterns PT may be derived.

For example, in case that a row including the first pattern PT1 and the second pattern PT2 is referred to as a first row, the average value of the sizes of the patterns in the first row may be about 2 micrometers. At this time, the measured value of the size of the first pattern PT1 may be about 2.1 micrometers, and the measured value of the size of the second pattern PT2 may be about 1.9 micrometers. In this case, the deviation amount (e.g., $CD_{1,1}$) of the CD of the first pattern PT1 may be about 0.1 micrometer. The deviation amount (e.g., $CD_{2,2}$) of the CD of the second pattern PT2 may be about-0.1 micrometer.

In the same or similar way, the deviation amount of each CD of the patterns located in the rows located on the first row may be derived. For example, the deviation amount of each CD of 121 patterns may be derived.

Deviation amounts of CDs of the patterns on the same line LN in the second direction DR2 may be added together. For example, the deviation amounts of the CD of each of the patterns located in the same column in the second direction DR2 may be added together. Through this, the values of the C matrix of FIG. 4 may be derived. For example, the first line may include the first pattern PT1 and the third pattern PT3. The value $(CD_{1,1}+CD_{1,2}+CD_{1,3} \ldots +CD_{1,11})$ of the first row of the C matrix of FIG. 4 may be derived by adding the deviation amounts of the CD of each of the 11 patterns PT including the first pattern PT1 and the third pattern PT3 of the first line LN. Similarly, the second line LN may include the second pattern PT2 and the fourth pattern PT4. The values $(CD_{2,2}+CD_{2,3}+CD_{2,4} \ldots +CD_{2,11})$ of the second row of the C matrix of FIG. 4 may be derived by adding the deviation amounts of the CD of 11 patterns PT including the second pattern PT2 and the fourth pattern PT4 of the second line LN.

For example, since all the values included in the A matrix are derived from the matrix equation of $B=A^{-1}\times C$ and all the values included in the C matrix are also derived, all the values included in the B matrix may be calculated.

Figure 6A:
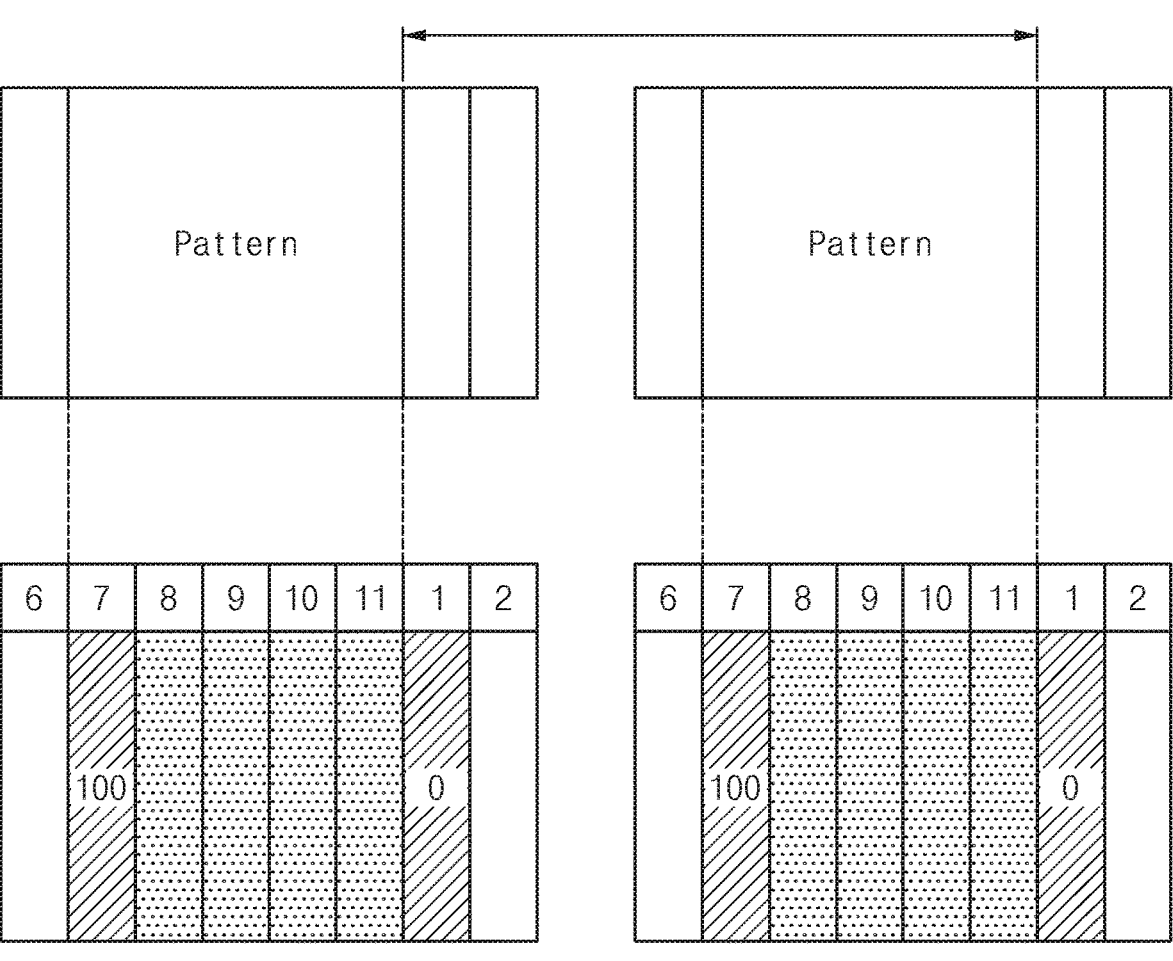
FIGS. 6A, 6B, and 7 are schematic views for explaining a correction method according to an embodiment of the disclosure.
Figure 6B:
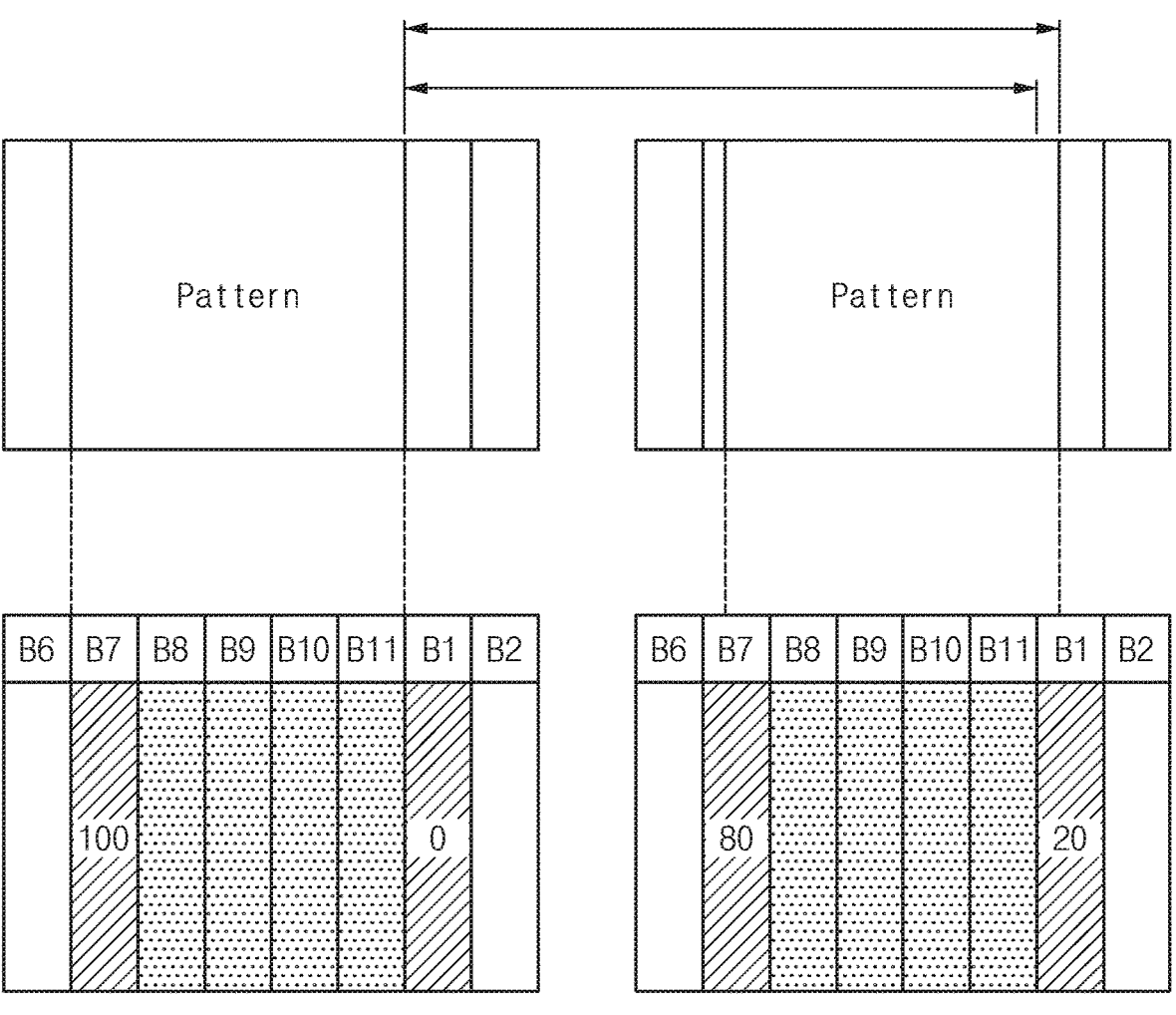
Figure 7:
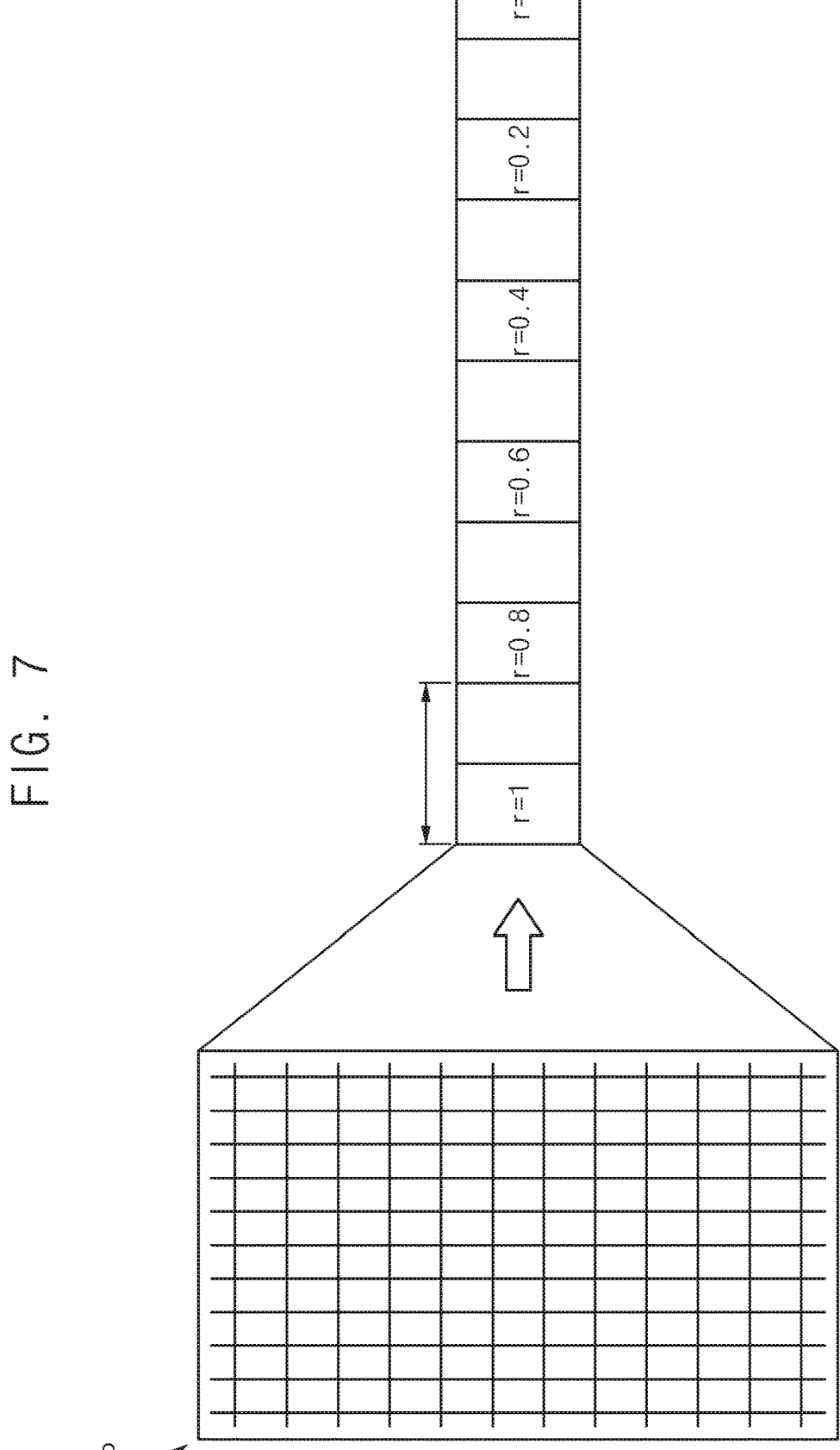

FIGS. 6A, 6B, and 7 are schematic views for explaining a correction method according to an embodiment of the disclosure.

Referring to FIGS. 6A and 6B, FIG. 6A may be a case in which beams corresponding to the pattern correspond exactly. For example, FIG. 6A may be the case that the pattern is disposed at the boundary of the beams. FIG. 6B may be a case in which beams corresponding to the pattern do not correspond accurately. For example, FIG. 6B may be the case that the pattern is disposed in the central part of the beams.

In FIG. 6A, the gray levels of the edge beams EB (e.g., the seventh beam B7 and the first beam B1) may be about 100% and about 0%, respectively. Accordingly, the effect on the size of the pattern of the second beams SB may not be large. In contrast, in FIG. 6B, the gray levels of the edge beams EB may be about 80% and about 20%, respectively. For example, since the combination of the multi-beams is about 20% further to the right, the gray level of the left edge beam EB may be about 80%, and the gray level of the right edge beam EB may be about 20%.

Accordingly, the effect of the second beams SB on the size of the pattern may be relatively greater than FIG. 6A. Accordingly, the size of each pattern in FIGS. 6A and 6B may be different from each other even though FIGS. 6A and 6B are the same beam combination and the same pattern.

Referring further to FIG. 7, the optimal dose amount of each of the beams BM may be derived in consideration of a state in which the gray levels of the edge beams EB are different from each other.

In an embodiment, the gray level (i.e., r value) of the edge beam EB of the multi-beam exposure device LA may be changed. The optimal dose amount of each of the beams BM may be derived by performing the above-described method in a state in which the gray level is different from each other.

For example, the r value in FIG. 7 may be the gray level of the edge beam EB, and the r values may differ from each other at regular intervals. The regular interval may be a decimal number between 0 and 1. For example, the r values may have values of 0, 0.2, 0.4, 0.6, 0.8, and 1 at intervals of 0.2. However, the disclosure is not limited thereto.

The optimal dose amounts of each of the beams BM may be derived for each gray level. For example, the optimal dose amounts of each of the beams BM where the r value is 1 may be derived from the optimal dose amounts of each of the beams BM where the r value is 0.

Thereafter, the average value of the optimal dose amounts may be derived as the final optimal dose amount. For example, an average value of the optimal dose amounts of each of the beams BM where the r value is 0 to the optimal dose amounts of each of the beams BM wherein the r value is 1 may be derived. The average value may be a final optimal dose amount of each of the beams BM.

Finally, the final optimal dose amount of each of the beams BM is compared with the measured dose amount of each of the beams BM to individually correct the dose amount of each of the beams BM.

In an embodiment, in case that the correction is performed according to the correction method, the dose amount of each of the beams BM included in the multi-beam exposure device LA may be individually corrected. At this time, by considering the variation amount in the deviation amount of the CD according to each beam, the gray level of the edge beam EB, and the effect on the variation amount in the size of pattern of the second beam SB according to the gray level of the edge beam, optimal dose amount in various multi-beam combinations may be calculated. In case that exposure is performed with the beams BM corrected to the optimal dose amount, since the deviation amount of the CD is minimized, size distribution of patterns according to the multi-beam combinations may be reduced. For example, in case that the multi-beam exposure device LA is corrected through the correction method, the size distribution of the patterns may be reduced in an exposure process using the multi-beam exposure device LA.

FIG. 8 is a table for explaining the effect of the disclosure.

Further referring to FIG. 8, REF value may indicate a value before correction. AFT Optimization value may indicate a value after correction. RANGE value may be the difference between the largest value and the smallest value among the deviation amounts of 121 types of the deviation amounts of the CD described with reference to FIG. 5.

Therefore, referring to the table, that the RANGE value after correction is reduced compared to before correction in all gray levels may be confirmed. Through this, that the dispersion of the size of the pattern can be reduced by the correction method may be confirmed.

The disclosure can be applied to various display devices. For example, the disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the disclosure. Accordingly, all such modifications are intended to be included within the scope of the disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A correction method of a multi-beam exposure device, the correction method comprising:

generating a first function that is a relational expression between a gray level of an edge beam among a plurality of beams and a variation amount in a size of a pattern according to a second beam adjacent to the edge beam;

obtaining a second function that is a relational expression between the first function, the gray level of the edge beam, and a variation amount in a deviation amount of a CD (critical dimension) and the deviation amount of the CD according to each of the plurality of beams;

generating a matrix equation by calculating a sum of a plurality of second functions including the second function taken over all multi-beam combinations in which the plurality of beams are differently combined;

deriving a solution of the matrix equation by measuring the deviation amount of the CD;

deriving an optimal dose amount of each of the plurality of beams by using the solution of the matrix equation; and correcting a dose amount of each of the plurality of beams of the multi-beam exposure device individually by using the optimal dose amount of each of the plurality of beams.

2. The correction method of claim 1, wherein the deviation amount of the CD is a difference between an average value of sizes of a plurality of patterns including the pattern and a measured value of the size of the pattern.

3. The correction method of claim 1, wherein the gray level of the edge beam and the variation amount in the size of the pattern according to the second beam are in inverse proportion to each other.

4. The correction method of claim 3, wherein the first function is a first-order or higher-order function in which the gray level of the edge beam and the variation amount in the size of the pattern according to the second beam are in inverse proportion to each other.

5. The correction method of claim 4, wherein the first function is represented by Equation 1 below:

[Equation 1]

$$f(r) = 4.02r^3 - 7.12r^2 + 1.03r + 2.69$$

wherein r is the gray level of the edge beam, r is 0 or more and 1 or less, and f(r) is the variation amount in the size of the pattern according to the second beam.

6. The correction method of claim 5, wherein the second function is represented by Equation 2 below:

[Equation 2]

$$CD_{n,m} = E_n \times r_n + E_{n+1} \times S(r_n) + E_m \times r_m + E_{m-1} \times S(r_m)$$

wherein each of n and m is an integer, where each of n and m is $0 \leq r \leq 1$, n is a number of a leftmost edge beam of the plurality of beams, m is a number of a rightmost edge beam of the plurality of beams, r is the gray level of the edge beam, E is the variation amount in the deviation amount of the CD of the edge beam, $CD_{n,m}$ is the deviation amount of the CD, and S(r) is a ratio of f(r) of the first function divided by f(0) of the first function.

7. The correction method of claim 6, wherein a maximum value of each of the n and m is a number of the plurality of beams.

8. The correction method of claim 6, wherein the matrix equation is represented by Equation below:

[Equation]

$$A \times B = C$$

wherein A matrix is an N×N square matrix including one of a, b, and c, B matrix is an N×1 matrix including E1 to $E_N$ values, C matrix is an N×1 matrix including a value obtained by adding the deviation amount of the CD where the n is 1 and the m is from 1 to N to a value obtained by adding deviation amounts of the CD where the n is N and the m is from 1 to N, N is a number of the plurality of beams and the a is $S(1-r)+10 \times r+1$, the b is $11 \times S(r)+S(1-r)-r+1$, and the c is $S(1-r)-r+1$ where $r_n+r_m=1$.

9. The correction method of claim 8, wherein the deriving of the solution of the matrix equation includes:

deriving values of the C matrix of the matrix equation by measuring the deviation amount of the CD; and calculating values of the B matrix which are the solution of the matrix equation.

10. The correction method of claim 9, wherein the deriving of the optimal dose of the plurality of beams includes:

converting the values of the B matrix into correction amounts of the optimal dose amount; and deriving the optimal dose amount for each of the plurality of beams by subtracting the correction amounts of the optimal dose amount from measured dose amounts of the plurality of beams, respectively.

11. The correction method of claim 10, wherein the converting of the values of the B matrix into the correction amounts of the optimal dose amount includes dividing the values of the B matrix by the value of f(0).

12. The correction method of claim 9, wherein the deriving of the values of the C matrix includes deriving the deviation amount of the CD of each of a plurality of patterns including the pattern in a combination pattern including N×N patterns.

13. The correction method of claim 12, wherein the combination pattern includes patterns formed by a multi-beam combination consisting of a combination of different beams among the plurality of beams.

14. The correction method of claim 12, wherein the combination pattern includes patterns having a same size in a first direction and formed by a multi-beam combination including different edge beams.

15. The correction method of claim 14, wherein the plurality of patterns of the combination pattern have different sizes in a second direction intersecting the first direction and are formed by the multi-beam combination in which one edge beam is a same.

16. The correction method of claim 15, wherein the deriving of the deviation amount of the CD of each of the patterns includes:

measuring a measurement value of a size of each of the plurality of patterns included in the combination pattern;

calculating an average value of sizes of patterns located in a same row in the first direction in the combination pattern; and calculating the deviation among of the CD by subtracting the average value from a measured value of the size of each of the patterns.

17. The correction method of claim 16, wherein the deriving of the values of the C matrix further includes:

deriving the values of the C matrix by adding the deviation amount of the CD of each of the patterns located in a same column in the second direction in the combination pattern.

18. The correction method of claim 1, wherein the correcting of the dose amount of each of the plurality of beams individually further includes:

changing the gray level of the edge beam of the multi-beam exposure device;

deriving the optimal dose amounts of each of the plurality of beams for each gray level;

deriving a final optimal dose amount that is an average value of the optimal dose amounts; and correcting the dose amount of each of the plurality of beams individually by comparing the final optimal dose amount of each of the plurality of beams and a measured dose amount of each of the plurality of beams.

19. The correction method of claim 18, wherein in the changing of the gray level of the edge beam of the multi-beam exposure device, gray levels are changed to different gray level values at regular intervals.

20. A correction method of a multi-beam exposure device, the correction method comprising:

generating a first function that is a relational expression between a gray level of an edge beam among a plurality of beams and a variation amount in a size of a pattern formed on a substrate according to a second beam adjacent to the edge beam;

obtaining a second function that is a relational expression between the first function, the gray level of the edge beam, and a variation amount in a deviation amount of a CD (critical dimension) and the deviation amount of the CD according to each of the plurality of beams;

generating a matrix equation by calculating a sum of a plurality of second functions including the second function taken over all multi-beam combinations in which the plurality of beams are differently combined; and using the generated matrix equation to adjust a dose amount of each of the plurality of beams during an exposure of the substrate to reduce the deviation amount of the CD in the pattern formed on the substrate.

\* \* \* \* \*